(12) United States Patent
Tsukahara (10) Patent No.: US 8,279,013 B2
(45) Date of Patent: Oct. 2, 2012

(54) POWER AMPLIFIER AND MMIC USING THE SAME

(75) Inventor: Yoshihiro Tsukahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/177,592

(22) Filed: Jul. 7, 2011

(65) Prior Publication Data

US 2012/0133436 A1    May 31, 2012

(30) Foreign Application Priority Data

Nov. 25, 2010  (JP) .................................. 2010-262651

(51) Int. Cl.
*H03F 3/04* (2006.01)
(52) U.S. Cl. ........................................ 330/302; 330/277
(58) Field of Classification Search .................. 330/302, 330/277, 129, 136
See application file for complete search history.

(56) References Cited

U.S. PATENT DOCUMENTS

| | | | | |
|---|---|---|---|---|
| 5,982,236 A | * | 11/1999 | Ishikawa et al. | 330/296 |
| 6,249,186 B1 | * | 6/2001 | Ebihara et al. | 330/277 |
| 7,439,802 B2 | * | 10/2008 | Tsai et al. | 330/109 |
| 7,609,115 B2 | * | 10/2009 | Whelan et al. | 330/302 |
| 7,795,965 B2 | * | 9/2010 | Suzuki et al. | 330/59 |

FOREIGN PATENT DOCUMENTS

| | | |
|---|---|---|
| JP | 64-49334 A | 2/1989 |
| JP | 10-247828 A | 9/1998 |
| JP | 2002-237728 A | 8/2002 |
| JP | 2008-219507 A | 9/2008 |
| JP | 2008-245081 A | 10/2008 |
| JP | 2008-271320 A | 11/2008 |

* cited by examiner

*Primary Examiner* — Henry Choe
(74) *Attorney, Agent, or Firm* — Leydig, Voit & Mayer, Ltd.

(57) ABSTRACT

A power amplifier includes an input terminal, an input matching circuit connected to the input terminal, an amplifying transistor having a gate connected to the input matching circuit, an output matching circuit connected to the drain of the amplifying transistor, an output terminal connected to the output matching circuit, and an inverting differentiator circuit for either inverting and then differentiating, or differentiating and then inverting, a signal from the input terminal. The output of the inverting differentiator circuit is connected to the gate.

6 Claims, 10 Drawing Sheets

FIG. 17

POWER AMPLIFIER AND MMIC USING THE SAME

BACKGROUND OF THE INVENTION

1. Field of the Invention

The present invention relates to a power amplifier which amplifies input power by means of an amplifying transistor and outputs it. The invention also relates to an MMIC using this power amplifier.

2. Background Art

Japanese Laid-Open Patent Publication No. 2008-245081 discloses a power amplifier in which a gate voltage suppression resistance is connected between the gate terminal of the amplifying transistor and the gate voltage terminal for supplying a gate voltage to the gate terminal.

The gate of the amplifying transistor of a power amplifier receives alternately high power and low power. When the power applied to the gate transitions from a high level to a low level, the drain current of the amplifying transistor also decreases. It should be noted that within a certain period of time after the transition of the power level, the drain current may drop by an amount greater than necessary. (This phenomenon is referred to herein as "rapid reduction of the drain current.") In some cases, this drop in the drain current has resulted in decreased gain of the power amplifier and increased noise factor.

SUMMARY OF THE INVENTION

The present invention has been made to solve the foregoing problems. It is, therefore, an object of the present invention is to provide a power amplifier capable of preventing rapid reduction of the drain current of its amplifying transistor which would otherwise occur immediately after the power applied to the gate has transitioned from a high level to a low level, while maintaining the performance of the power amplifier. Another object of the invention is to provide an MMIC using this power amplifier.

According to one aspect of the present invention, a power amplifier includes an input terminal, an input matching circuit connected to the input terminal, an amplifying transistor having a gate connected to the input matching circuit, an output matching circuit connected to the drain of the amplifying transistor, an output terminal connected to the output matching circuit, and an inverting differentiator circuit for either inverting and then differentiating or differentiating and then inverting a signal from the input terminal. The output of the inverting differentiator circuit is connected to the gate.

According to another aspect of the present invention, an MMIC includes an input terminal, an input matching circuit connected to the input terminal, an amplifying transistor having a gate connected to the input matching circuit, an inverting differentiator circuit for either inverting and then differentiating or differentiating and then inverting a signal from the input terminal, the inverting differentiator circuit including a detector circuit and an edge detection circuit, a first substrate on which the input matching circuit, the amplifying transistor, and the detector circuit are formed, and a second substrate on which the edge detection circuit is formed. The output of the inverting differentiator circuit is connected to the gate.

According to another aspect of the present invention, an MMIC includes an input terminal, an input matching circuit connected to the input terminal, an amplifying transistor having a gate connected to the input matching circuit, an inverting differentiator circuit for either inverting and then differentiating or differentiating and then inverting a signal from the input terminal, the inverting differentiator circuit including a detector circuit and an edge detection circuit, a first substrate on which the input matching circuit and the amplifying transistor are formed, and a second substrate on which the detector circuit and the edge detection circuit are formed. The output of the inverting differentiator circuit is connected to the gate.

Other and further objects, features and advantages of the invention will appear more fully from the following description.

DETAILED DESCRIPTION OF THE PREFERRED EMBODIMENTS

First Embodiment

Figure 1:
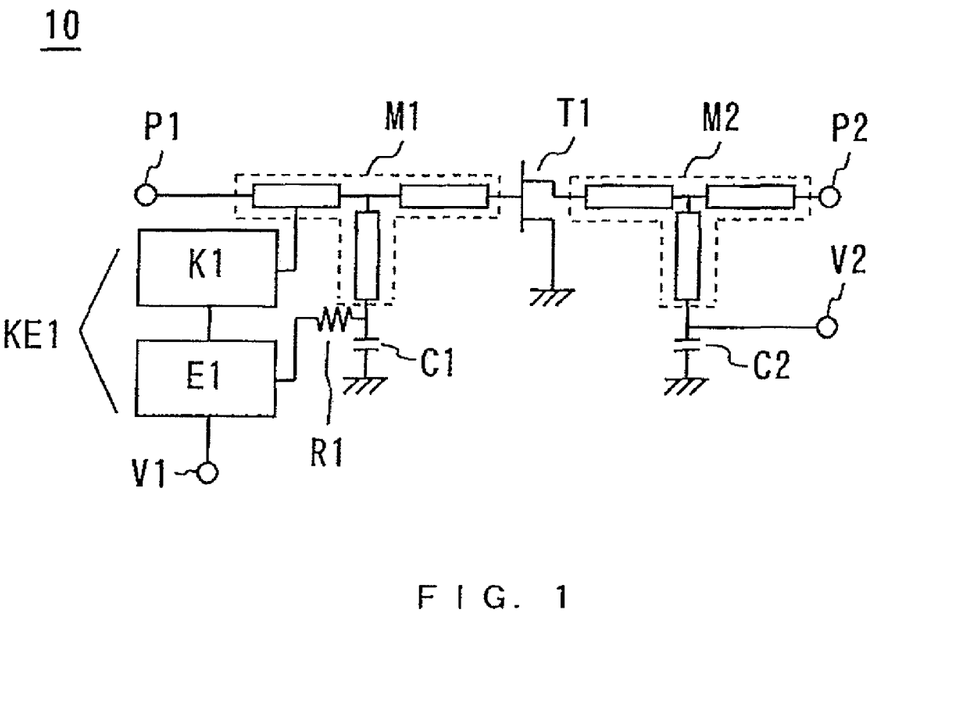
FIG. 1 is a diagram showing a power amplifier in accordance with a first embodiment of the present invention.

FIG. 1 is a diagram showing a power amplifier 10 in accordance with a first embodiment of the present invention. In this power amplifier 10, the power input to an input terminal P1 is amplified by an amplifying transistor T1 and output from an output terminal P2. The following description will be directed to the details of the power amplifier 10.

The power amplifier 10 includes the amplifying transistor T1. The amplifying transistor T1 is a field effect transistor formed on a semi-insulating substrate. An input matching circuit M1 is connected to the gate of the amplifying transistor T1. The input matching circuit M1 connects the input terminal P1 to the gate of the amplifying transistor T1.

A detector circuit K1 is connected to the input matching circuit M1. The detector circuit K1 detects the signal from the input terminal P1, inverts the detected signal, and outputs it. An edge detection circuit E1 is connected to the output of the detector circuit K1. The edge detection circuit E1 is a differentiator circuit adapted to differentiate the output from the detector circuit K1 and output the differentiated signal. This edge detection circuit E1 is a combination of a capacitance and a resistance. The detector circuit K1 and the edge detection circuit E1 are referred to collectively as the "inverting differentiator circuit KE1."

The output of the edge detection circuit E1 (i.e., the output of the inverting differentiator circuit KE1) is connected to the gate of the amplifying transistor T1 through a gate bias resistance R1 and the input matching circuit M1. One end of a DC blocking capacitance C1 is connected between the gate bias resistance R1 and the input matching circuit M1. The other end of the DC blocking capacitance C1 is grounded. Further, a gate voltage terminal V1 for supplying a gate voltage is connected to the edge detection circuit E1.

An output matching circuit M2 is connected to the drain of the amplifying transistor T1. The output matching circuit M2 connects the drain of the amplifying transistor T1 to the output terminal P2. Further, a drain voltage terminal V2 for supplying a drain voltage is connected to the output matching circuit M2. One end of a DC blocking capacitance C2 is connected between the drain voltage terminal V2 and the output matching circuit M2. The other end of the DC blocking capacitance C2 is grounded.

Figure 2:
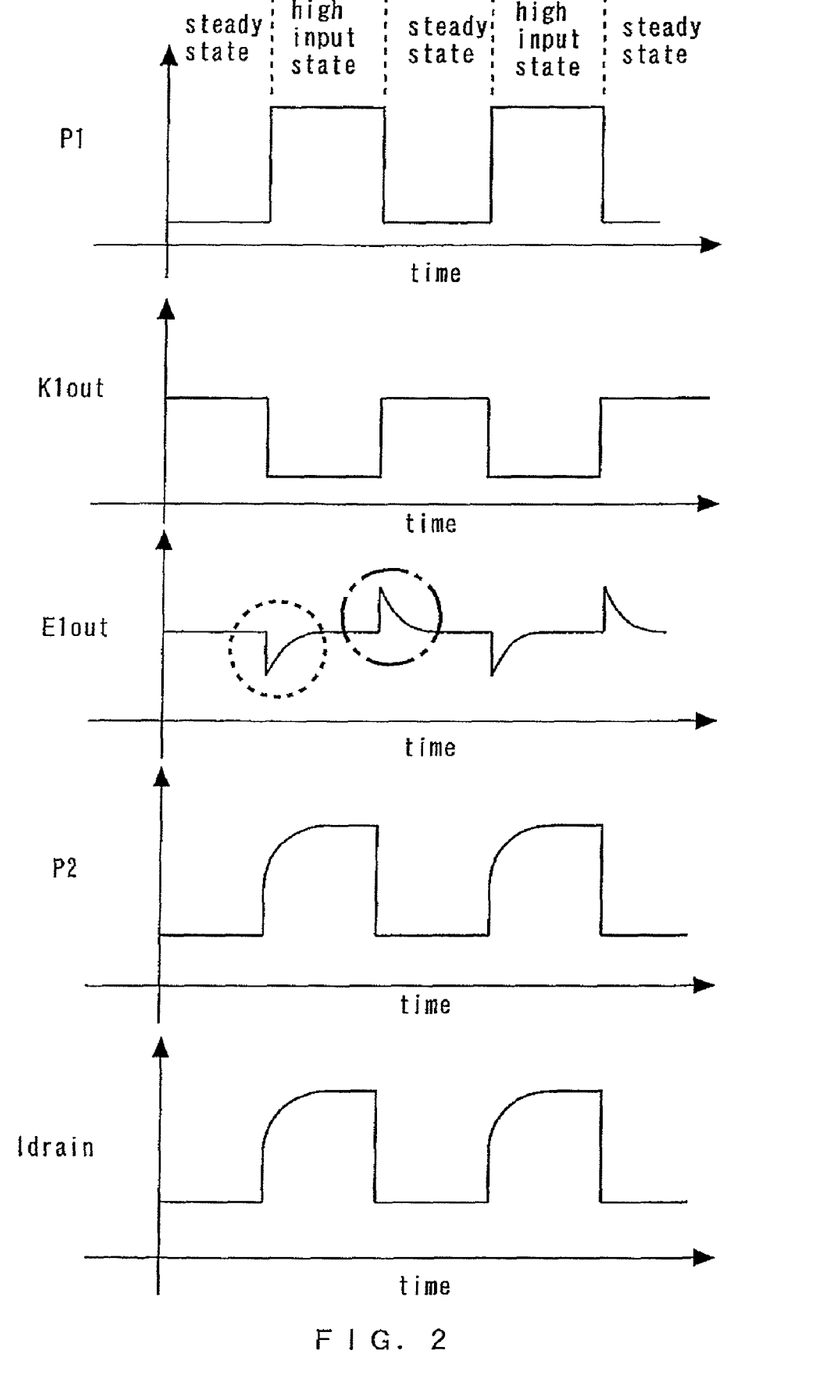
FIG. 2 is a diagram showing the waveforms at selected points in the power amplifier of the first embodiment.

The source of the amplifying transistor T1 is grounded. The configuration of the power amplifier 10 of the first embodiment has been described above. The operation of the power amplifier 10 will now be described with reference to FIG. 2. FIG. 2 is a diagram showing the waveforms at selected points in the power amplifier 10 of the first embodiment. Specifically, FIG. 2 shows, from top to bottom, the waveform of the input power to the input terminal P1, the waveform of the output voltage of the detector circuit K1, the waveform of the output voltage of the edge detection circuit E1, the waveform of the output power from the output terminal P2, and the waveform of the drain current of the amplifying transistor T1.

First, steady-state power (hereinafter referred to as low power) is applied to the input terminal P1 so that the power amplifier assumes a steady state. Next, the power applied to the input terminal P1 is increased from the low level (or low power) to a predetermined high level. This causes the power amplifier 10 to transition from the steady state to a high input state. (This transition of the power amplifier 10 from the steady state to the high input state is hereinafter referred to as the first transition.) As a result of the first transition, the detector circuit K1 outputs a negative voltage, since the detector circuit K1 inverts the high power applied to the input terminal P1 and detects the negative voltage. The edge detection circuit E1 then outputs a waveform which is the derivative of the waveform of the output from the detector circuit K1. This derivative or differential waveform is downwardly convex as indicated within the dashed circle in FIG. 2. The output from the edge detection circuit E1 is applied to the gate of the amplifying transistor T1 through the gate bias resistance R1 and the input matching circuit M1.

Thus, the polarity of the output power from the edge detection circuit E1 immediately after the first transition is such that the output power cancels out some of the high power applied from the input terminal P1 to the gate. That is, the application of the output power of the edge detection circuit E1 to the gate immediately after the first transition reduces the total amount of power applied to gate, so that the power from the output terminal P2 gradually, not abruptly, increases.

Then, the power amplifier 10 transitions from the high input state to the steady state. (This transition of the power amplifier 10 from the high input state to the steady state is hereinafter referred to as the second transition.) As a result of the second transition, the detector circuit K1 outputs a positive voltage, since the detector circuit K1 inverts the low power applied to the input terminal P1 and detects the positive voltage. The edge detection circuit E1 then outputs a waveform which is the derivative of the waveform of the output from the detector circuit K1. This derivative waveform is upwardly convex as indicated within the chain circle in FIG. 2. The output from the edge detection circuit E1 is applied to the gate of the amplifying transistor T1 through the gate bias resistance R1 and the input matching circuit M1.

Thus, the polarity of the output power of the edge detection circuit E1 immediately after the second transition is the same as that of the low power applied from the input terminal P1 to the gate. Therefore, the application of the output power of the edge detection circuit E1 to the gate immediately after the second transition increases the total amount of power applied to the gate.

Figure 3:
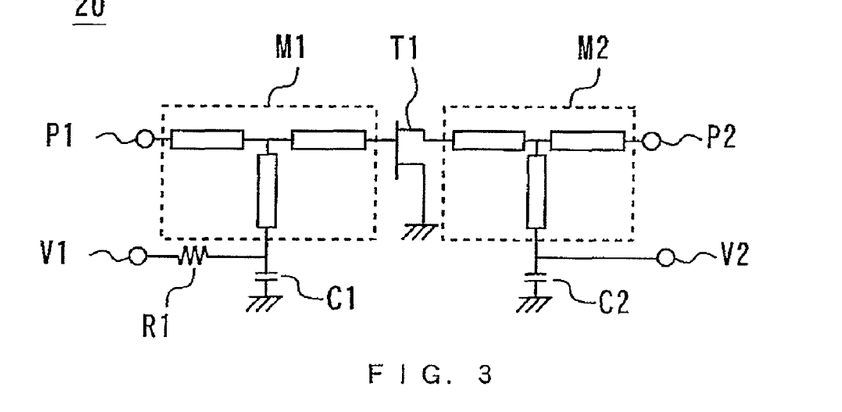
FIG. 3 is a diagram showing a comparative power amplifier.

A comparative example will be described to facilitate understanding of the power amplifier 10 of the first embodiment. FIG. 3 is a diagram showing a comparative power amplifier 20. This power amplifier 20 differs from the power amplifier 10 of the first embodiment in that the detector circuit K1 and the edge detection circuit E1 are omitted. That is, in the power amplifier 20, only the input power received by the input terminal P1 is applied to the gate of the amplifying transistor T1.

Figure 4:
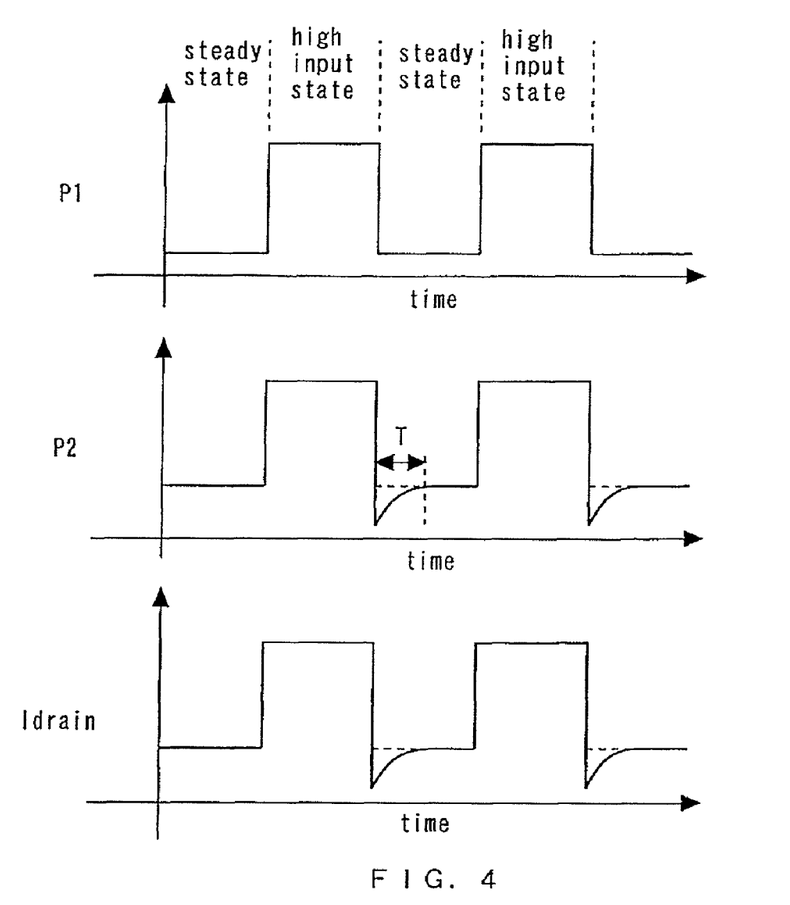
FIG. 4 is a diagram showing the waveforms at selected points in the comparative power amplifier.

FIG. 4 is a diagram showing the waveforms at selected points in the comparative power amplifier 20. Specifically, FIG. 4 shows, from top to bottom, the waveform of the input power to the input terminal P1, the waveform of the output power from the output terminal P2, and the waveform of the drain current of the amplifying transistor T1. The drain current of the power amplifier 20 rapidly decreases during a certain period of time immediately after the second transition. This rapid decrease in the drain current is attributed to the fact that, when the power amplifier 20 was in the high input state, carriers were trapped in trap levels at interfaces in the amplifying transistor T1 due to the increased drain current and the application of a high voltage to the gate. The drain current continues to rapidly decrease for a certain period of time and then stabilizes and returns to a steady-state value. The term "recovery period" is used to refer to the time it takes for the drain current to return to a steady-state value after the second transition. (This recovery period is indicated by reference symbol T in FIG. 4.) The comparative power amplifier 20 exhibits a decreased gain and an increased noise factor due to this recovery period.

In the power amplifier 10 of the first embodiment, on the other hand, in addition to the low power from the input terminal P1, the output power from the edge detection circuit E1 is applied to the gate immediately after the second transition. Therefore, the gate voltage of the amplifying transistor of the power amplifier 10 immediately after the second transition is high, as compared to the comparative power amplifier 20. This prevents rapid reduction of the drain current, allowing the drain current to momentarily return to a steady state immediately after the second transition.

Further, in the power amplifier 10 of the first embodiment, the output power from the edge detection circuit E1 is applied to the gate during the first transition. The output voltage of the edge detection circuit E1 during the first transition acts to reduce the effect of the high power applied from the input terminal P1 to the gate. That is, immediately after the first transition, the gate voltage of the amplifying transistor T1 of the power amplifier 10 is low, as compared to the comparative power amplifier 20, thus avoiding damage to the amplifying transistor T1 due to the application of high power to the gate.

Thus, in the power amplifier 10 of the first embodiment, the gate voltage does not rapidly increase immediately after the first transition and the drain current does not rapidly decrease immediately after the second transition, although the power amplifier 10 has a simple configuration, which is similar to that of the comparative power amplifier 20 but is provided with the detector circuit K1 and the edge detection circuit E1.

It should be noted that a limiter or switch may be connected to the input terminal P1, and power may be applied through this limiter or switch to the input terminal P1 so as to limit the power input to the input terminal P1 to a predetermined level during the first transition. However, the use of such a limiter or switch results in an increased noise factor of the reception system including the power amplifier, thereby degrading the reception sensitivity. Further, the use of a limiter or switch cannot prevent rapid reduction of the drain current during the second transition. On the other hand, the power amplifier 10 of the first embodiment is provided with the detector circuit K1 and the edge detection circuit E1, eliminating the need to connect a limiter or switch to the input terminal and apply power through this limiter or switch to the input terminal. Thus, the advantages described above can be obtained while maintaining the performance of the reception system.

Figure 5:
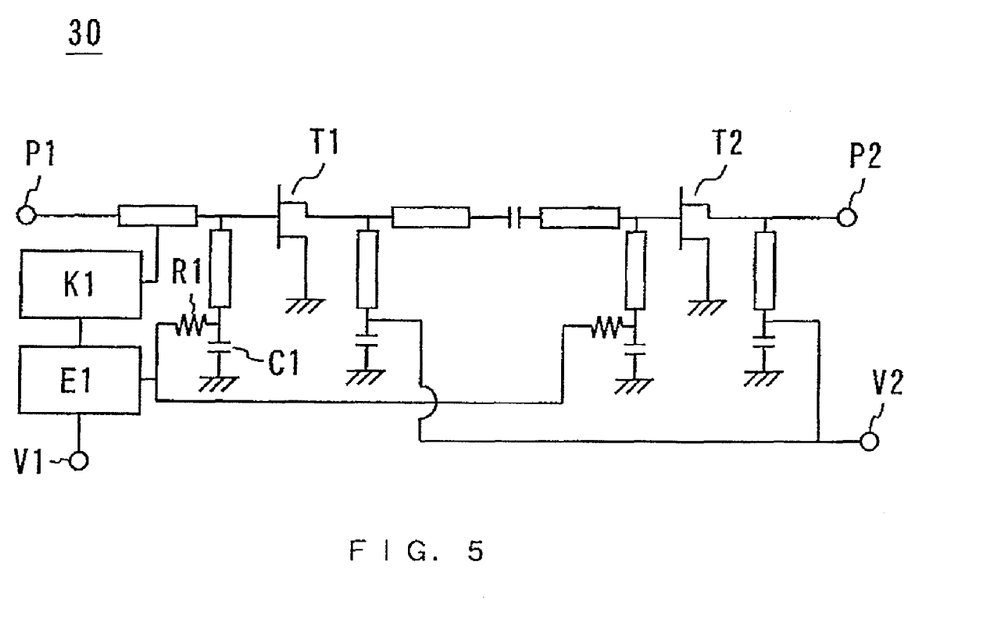
FIG. 5 is a diagram showing a first variation of the power amplifier of the first embodiment.

FIG. 5 is a diagram showing a first variation of the power amplifier of the first embodiment. This power amplifier, 30, includes an amplifying transistor T2 connected to the output side of the amplifying transistor T1. With this arrangement, the output power from the edge detection circuit E1 is applied to the gate of the amplifying transistor T2, as well as to the gate of the amplifying transistor T1. As a result, it is possible to prevent rapid reduction of the drain current of the amplifying transistor T2, as well as rapid reduction of the rain current of the amplifying transistor T1. Although in this example the power amplifier includes two amplifying transistors, in other examples the power amplifier may include three or more amplifying transistors, since the output of the edge detection circuit can be connected to the gates of a plurality of amplifying transistors.

Figure 6:
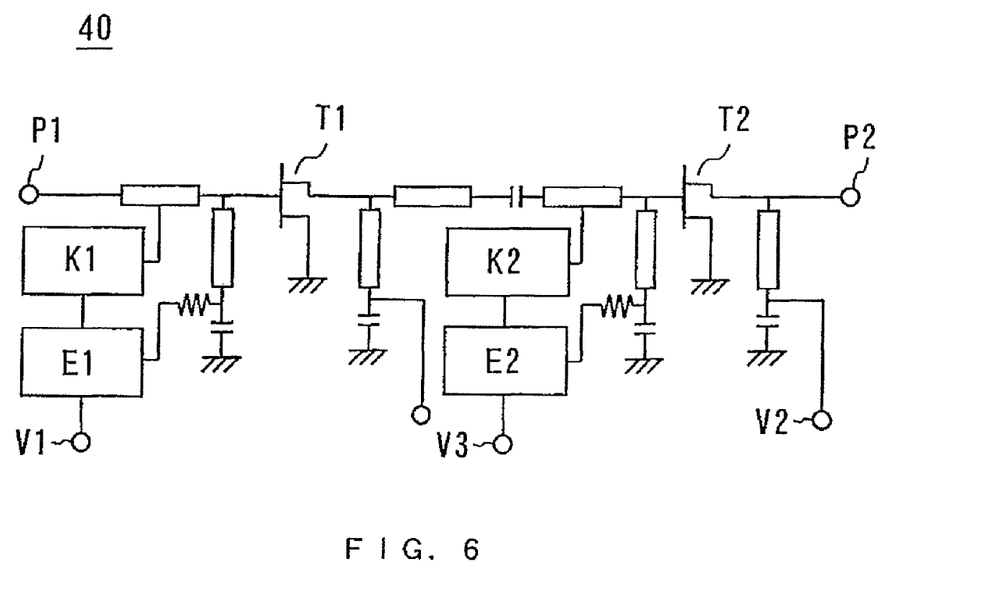
FIG. 6 is a diagram showing a second variation of the power amplifier of the first embodiment.

FIG. 6 is a diagram showing a second variation of the power amplifier of the first embodiment. This power amplifier, 40, includes an amplifying transistor T2 connected to the output side of the amplifying transistor T1. This power amplifier is characterized in that it includes a plurality of amplifying transistors (namely, two amplifying transistors) and that an detector circuit and an edge detection circuit are provided for each amplifying transistor. Specifically, a detector circuit K1 and an edge detection circuit E1 are provided to increase and decrease the power to the gate of the amplifying transistor T1 in the manner described above. Further, a detector circuit K2 and an edge detection circuit E2 are provided to increase and decrease the power to the gate of the amplifying transistor T2 in the manner described above. The functions of the detector circuits K1 and K2 and the edge detection circuits E1 and E2 are the same as those described above, and hence a description thereof will not be provided herein.

In the case of a power amplifier including a plurality of amplifying transistors (hereinafter referred to as a power amplifier having a multistage configuration), even when the first stage (i.e., the amplifying transistor T1) is in a steady state, the second stage (i.e., the amplifying transistor T2), which receives the signal amplified by the first stage, may be in a high input state. When a plurality of amplifying transistors are thus in different operating states, the application of the output power of one common edge detection circuit to their gates may not achieve the advantages of the invention described above.

Therefore, separate detector circuits and separate edge detection circuits may be connected to the first stage (i.e., the amplifying transistor T1) and the second stage (i.e., the amplifying transistor T2), as in the variation shown in FIG. 6, making it possible to apply a gate voltage to the second stage in accordance with the operating state of the second stage, as is the case with the first stage. Although in this variation the power amplifier includes two amplifying transistors, or stages, it is to be understood that the power amplifier may have any multistage configuration (including two or more amplifying transistors).

In some power amplifiers having a multistage configuration, the first stage is constantly in a steady state and does not assume a high input state. In this case, there is no need for the first stage to be provided with a detector circuit and an edge detection circuit.

In the inverting differentiator circuit KE1 of the power amplifier 10 of the first embodiment, the signal from the input terminal P1 is first inverted by the detector circuit K1 and then differentiated by the edge detection circuit E1. However, the inverting differentiator circuit KE1 may have a different configuration. Specifically, the positions of the detector circuit K1 and the edge detection circuit E1 may be exchanged so that the signal from the input terminal P1 is first differentiated by the edge detection circuit E1 and then inverted by the detector circuit K1. This also applies to other embodiments of the invention subsequently described.

Second Embodiment

Figure 7:
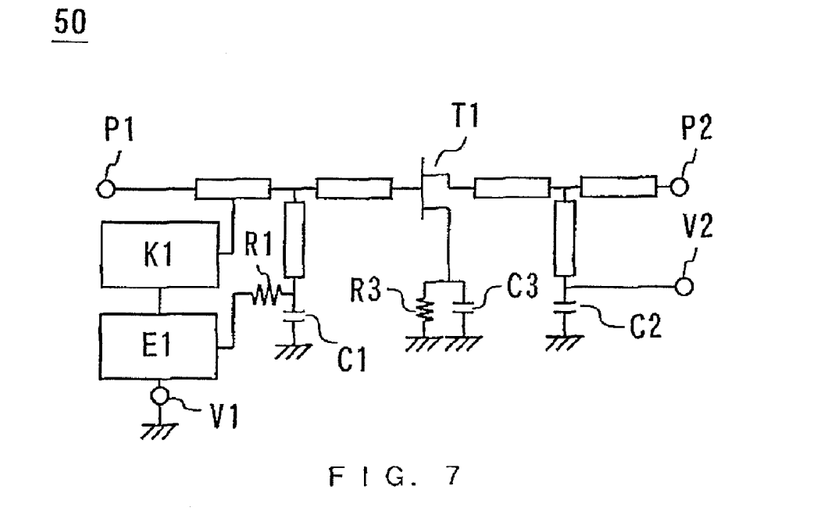
FIG. 7 is a diagram showing a power amplifier in accordance with a second embodiment of the present invention.

FIG. 7 is a diagram showing a power amplifier 50 in accordance with a second embodiment of the present invention. The following description of the power amplifier 50 will focus on the differences from the power amplifier 10 of the first embodiment.

The gate voltage terminal V1 connected to the edge detection circuit E1 is grounded. Further, one end of a resistance R3 and one end of a capacitor C3 are connected to the source of the amplifying transistor T1, and the other end of the resistance R3 and the other end of the capacitor C3 are grounded.

When the power amplifier 50 is in its steady state, the gate voltage of the amplifying transistor T1 is grounded at 0 V, eliminating the need to externally apply the gate voltage. As a result, the power amplifier 50 can have a compact and simplified configuration. The power amplifier 50 also has the advantages described above in connection with the first embodiment.

Figure 8:
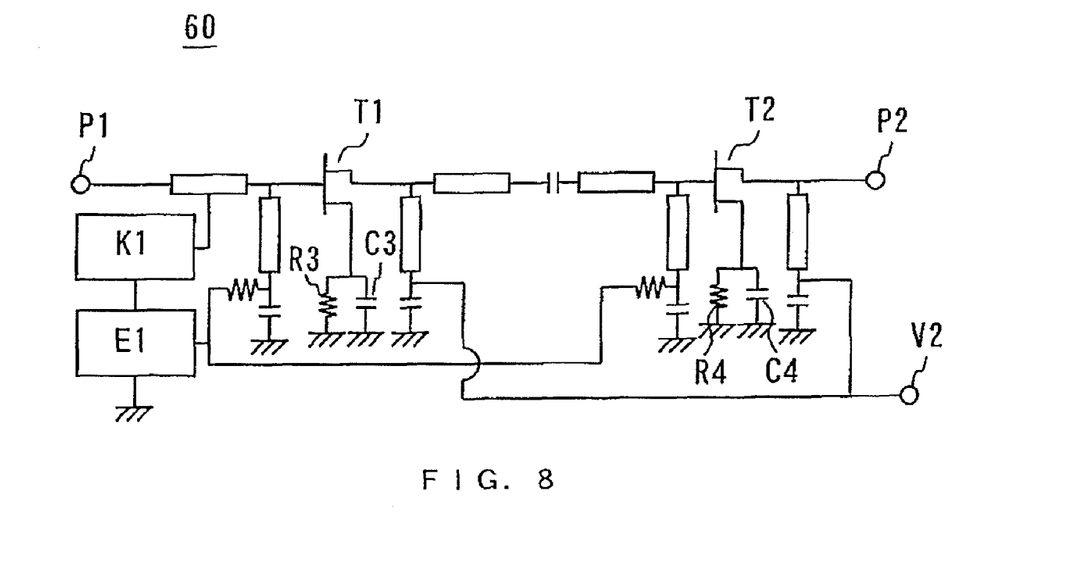
FIG. 8 is a diagram showing a variation of the power amplifier of the second embodiment.

FIG. 8 is a diagram showing a variation of the power amplifier 50 of the second embodiment. This power amplifier, 60, includes amplifying transistors T1 and T2, as shown in FIG. 8. One end of a resistance R4 and one end of a capacitor C4 are connected to the source of the amplifying transistor T2, and the other end of the resistance R4 and the other end of the capacitor C4 are grounded. The output power of the common edge detection circuit E1 is applied to the gates of the amplifying transistors T1 and T2. With this arrangement, when the power amplifier 60 is in its steady state, the gate voltages of the amplifying transistors T1 and T2 are grounded at 0 V, allowing the power amplifier 60 to have a compact and simplified configuration. Furthermore, it is possible to prevent rapid reduction of the drain current of the amplifying transistor T2, as well as rapid reduction of the drain current of the amplifying transistor T1.

Figure 9:
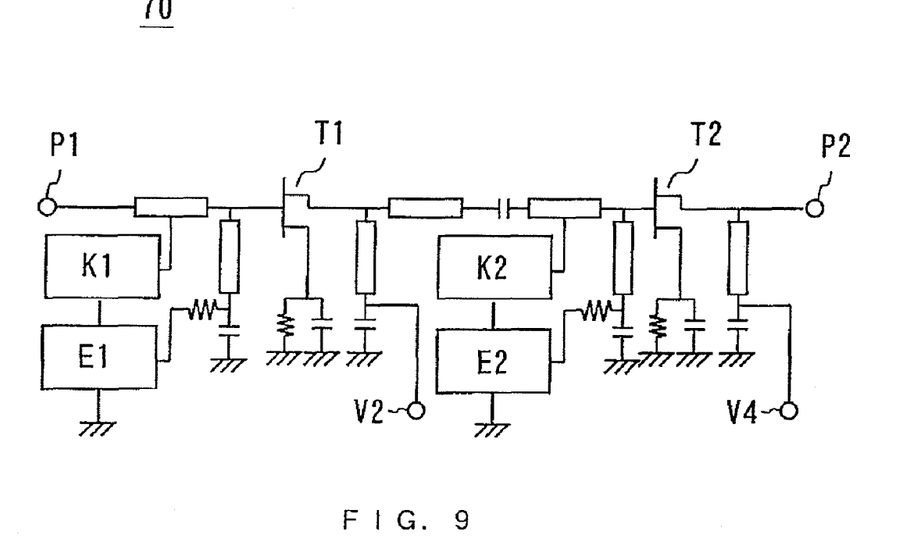
FIG. 9 is a diagram showing another variation of the power amplifier of the second embodiment.

FIG. 9 is a diagram showing another variation of the power amplifier 50 of the second embodiment. In this power amplifier, 70, a detector circuit K1 and an edge detection circuit E1 are provided for the first stage amplifying transistor T1, and a detector circuit K2 and an edge detection circuit E2 are provided for the second stage amplifying transistor T2, as shown in FIG. 9. Thus, a separate detector circuit and a separate edge detection circuit are provided for each amplifying transistor, making it possible to apply a gate voltage to the second stage in accordance with the operating state of the second stage, as is the case with the first stage.

In addition to the above variations, the power amplifier of the second embodiment is susceptible of at least alterations which are the same as or correspond to those that can be made to the power amplifier of the first embodiment.

Third Embodiment

Figure 10:
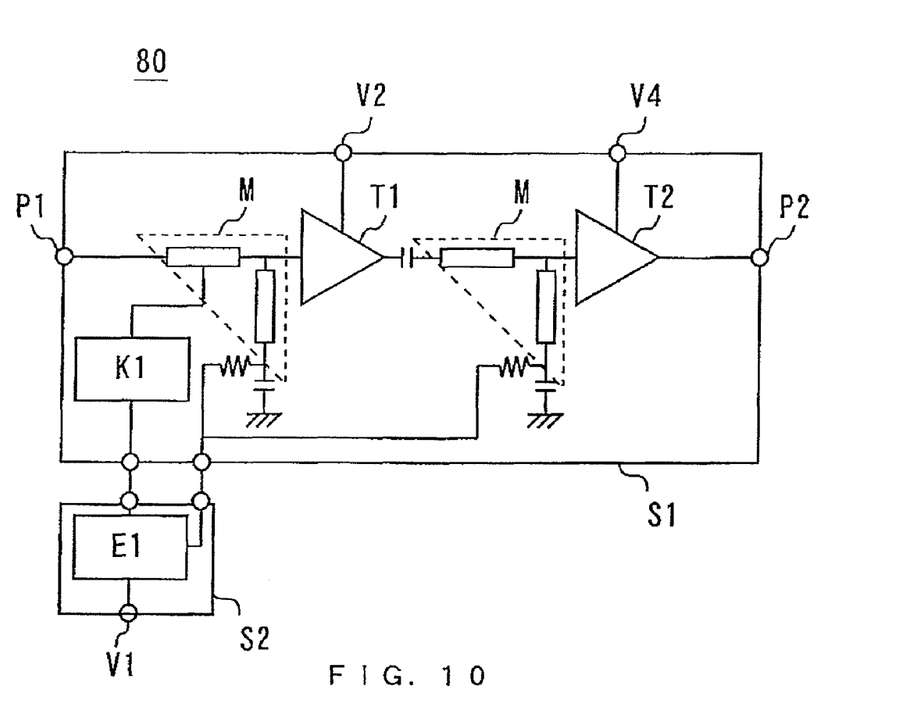
FIG. 10 is a diagram showing an MMIC in accordance with a third embodiment of the present invention.

FIG. 10 is a diagram showing an MMIC 80 in accordance with a third embodiment of the present invention. The following description of the MMIC 80 will focus on the differences from the power amplifier 10 of the first embodiment.

The MMIC 80 includes a first substrate S1 on which are formed an input terminal P1, a matching circuit M, amplifying transistors T1 and T2, and a detector circuit K1. The first substrate S1 is a semi-insulating substrate. Further, the MMIC 80 also includes a second substrate S2 on which an edge detection circuit E1 is formed. This MMIC configuration makes it possible to externally adjust the values of the capacitance and resistance of the edge detection circuit E1 and thereby change the time constant. This means that the time constant may be adjusted and optimized when it is necessary to adjust the recovery period in order to accommodate variations in the performance of the amplifying transistor T1.

Figure 11:
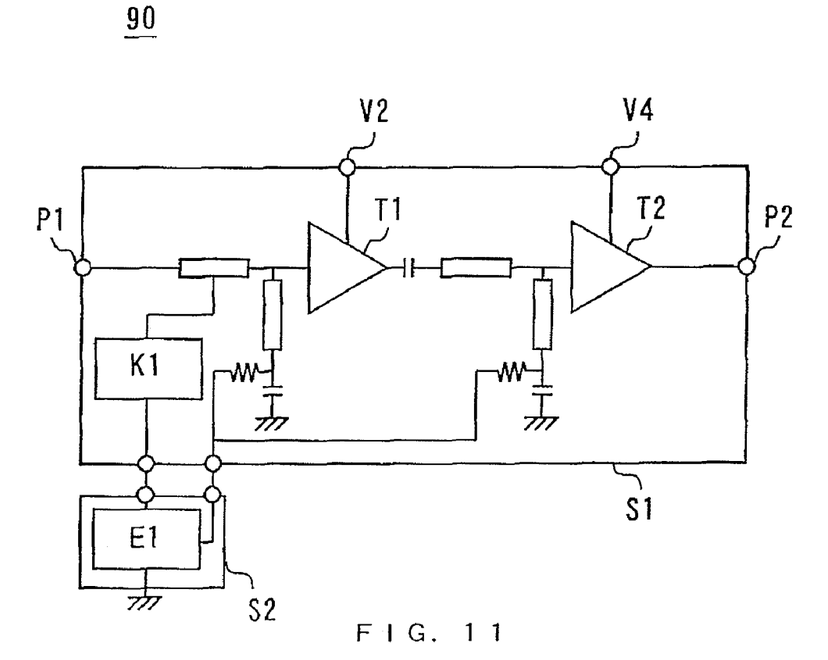
FIG. 11 is a diagram showing a variation of the MMIC of the third embodiment.

FIG. 11 is a diagram showing a variation of the MMIC of the third embodiment. This MMIC, 90, has amplifying transistors in a multistage configuration and is characterized in that it has features described above in connection with the first variation of the power amplifier of the first embodiment and, furthermore, the edge detection circuit E1 is formed on a separate substrate (namely, a second substrate S2).

Figure 12:
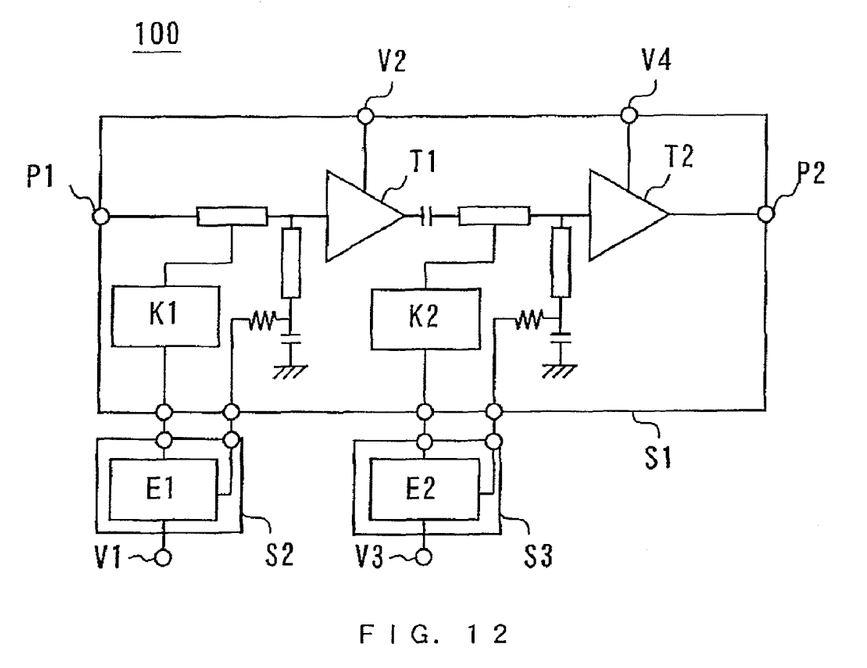
FIG. 12 is a diagram showing another variation of the MMIC of the third embodiment.

FIG. 12 is a diagram showing another variation of the MMIC of the third embodiment. This MMIC, 100, has amplifying transistors in a multistage configuration and is characterized in that it has features described above in connection with the second variation of the power amplifier of the first embodiment and, furthermore, edge detection circuits E1 and E2 are formed on separate substrates (namely, a second substrate S2 and a third substrate S3, respectively).

Figure 13:
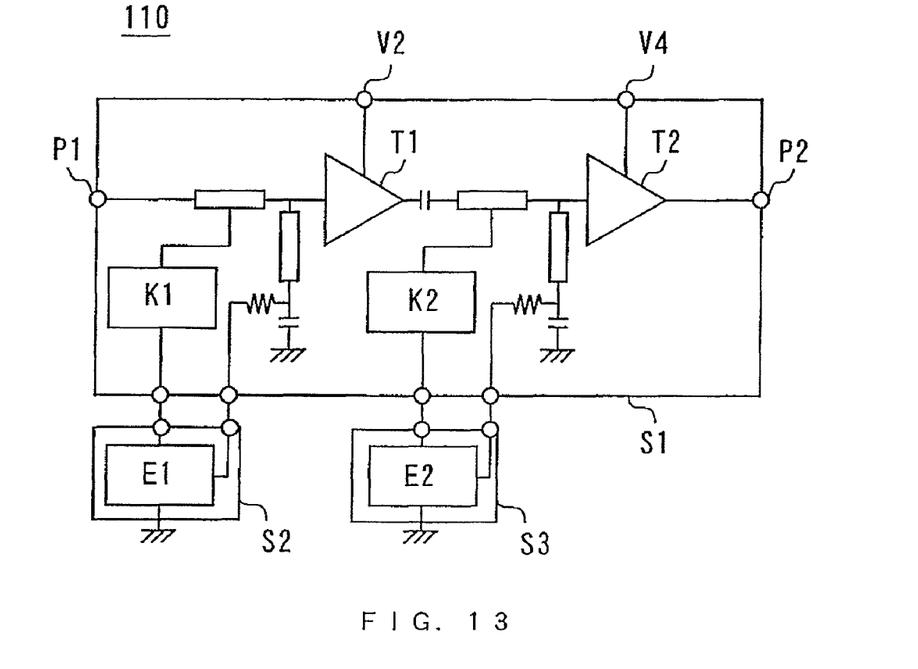
FIG. 13 is a diagram showing still another variation of the MMIC of the third embodiment.

FIG. 13 is a diagram showing still another variation of the MMIC of the third embodiment. This MMIC, 110, has amplifying transistors in a multistage configuration and is characterized in that it has features described above in connection with the second embodiment and, furthermore, edge detection circuits E1 and E2 are formed on separate substrates (namely, a second substrate S2 and a third substrate S3, respectively). In this way, the features described above in connection with the first and second embodiments may be added to the MMIC of the third embodiment.

Fourth Embodiment

Figure 14:
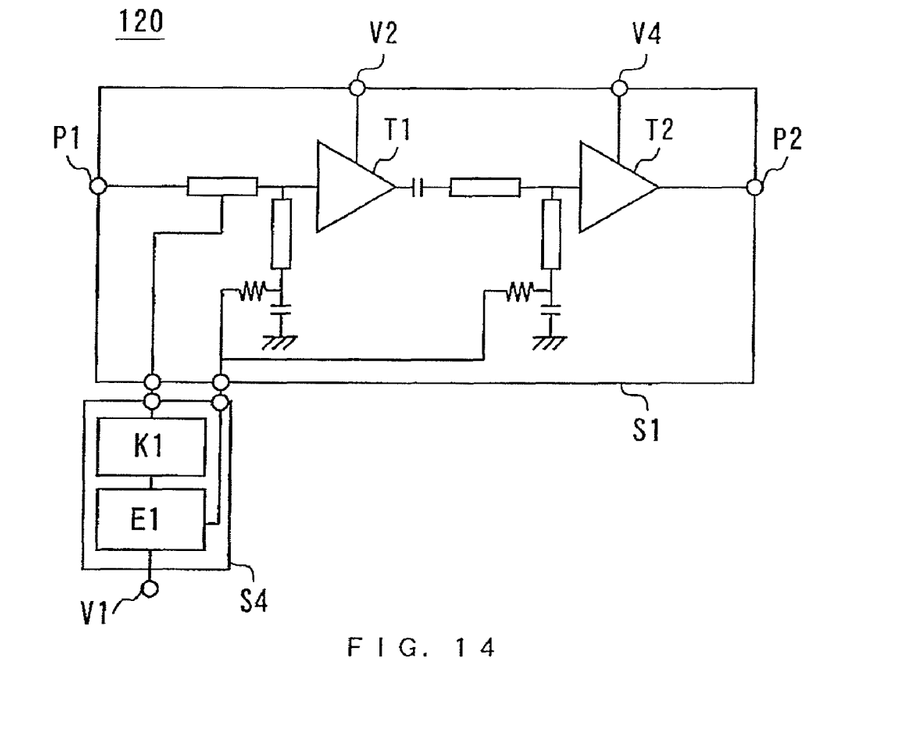
FIG. 14 is a diagram showing an MMIC in accordance with a fourth embodiment of the present invention.

FIG. 14 is a diagram showing an MMIC 120 in accordance with a fourth embodiment of the present invention. The following description of the MMIC 120 will focus on the differences from the MMIC 80 of the third embodiment.

The MMIC 120 includes a second substrate S4 on which the detector circuit K1 and the edge detection circuit E1 are formed. That is, in the MMIC 120 of the fourth embodiment, both the detector circuit K1 and the edge detection circuit E1 are formed on the second substrate S4, whereas in the MMIC 80 of the third embodiment only the edge detection circuit E1 is formed on a separate substrate. The configuration of the MMIC 120 enables the level of the detected voltage signal to be adjusted in accordance with the input power. This means that the MMIC 120 can be incorporated in systems which supply different levels of power to the input of the MMIC 120.

Figure 15:
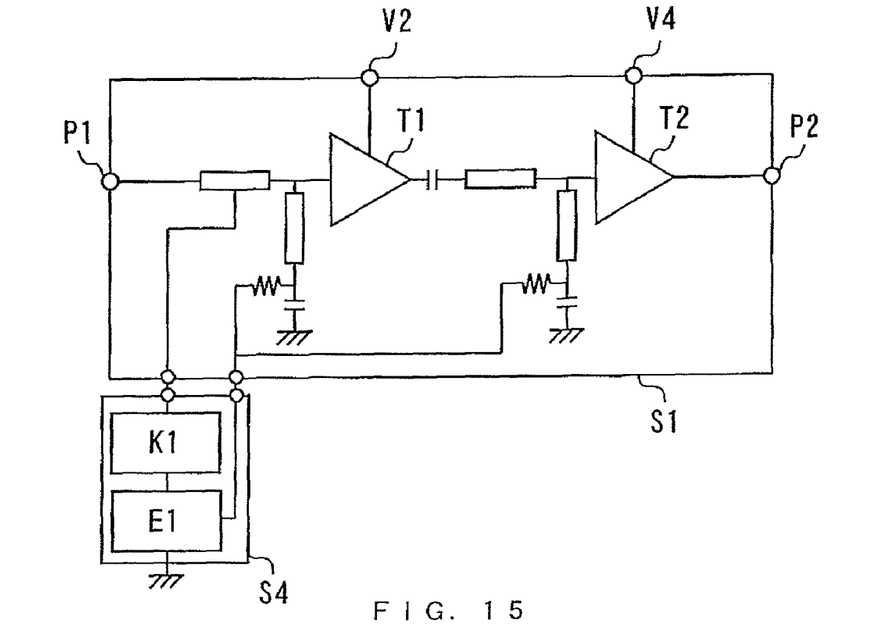
FIGS. 15, 16, and 17 are diagrams showing variations of the MMIC of the fourth embodiment.
Figure 16:
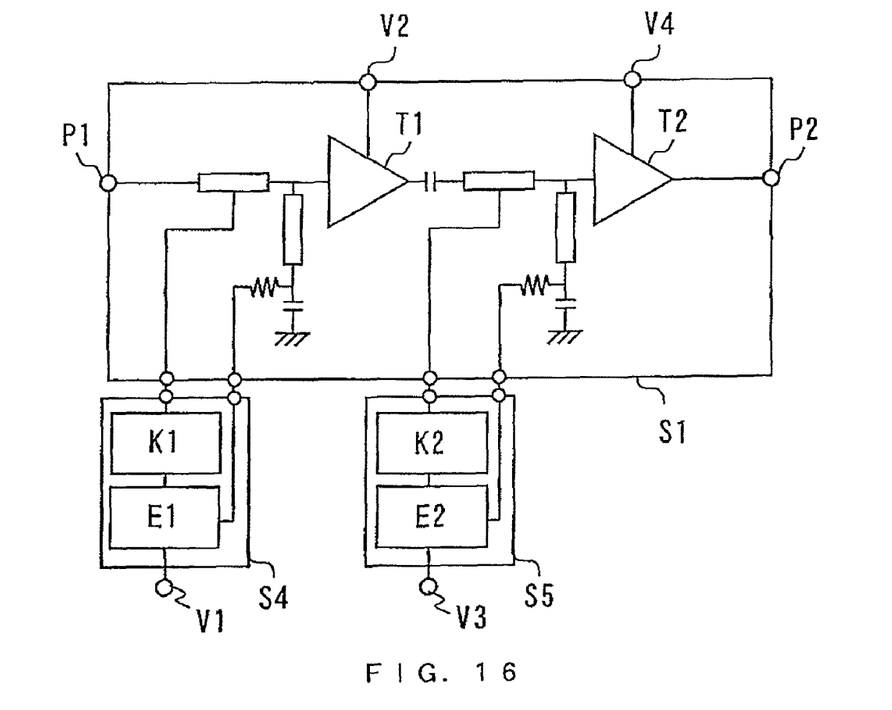
Figure 17:
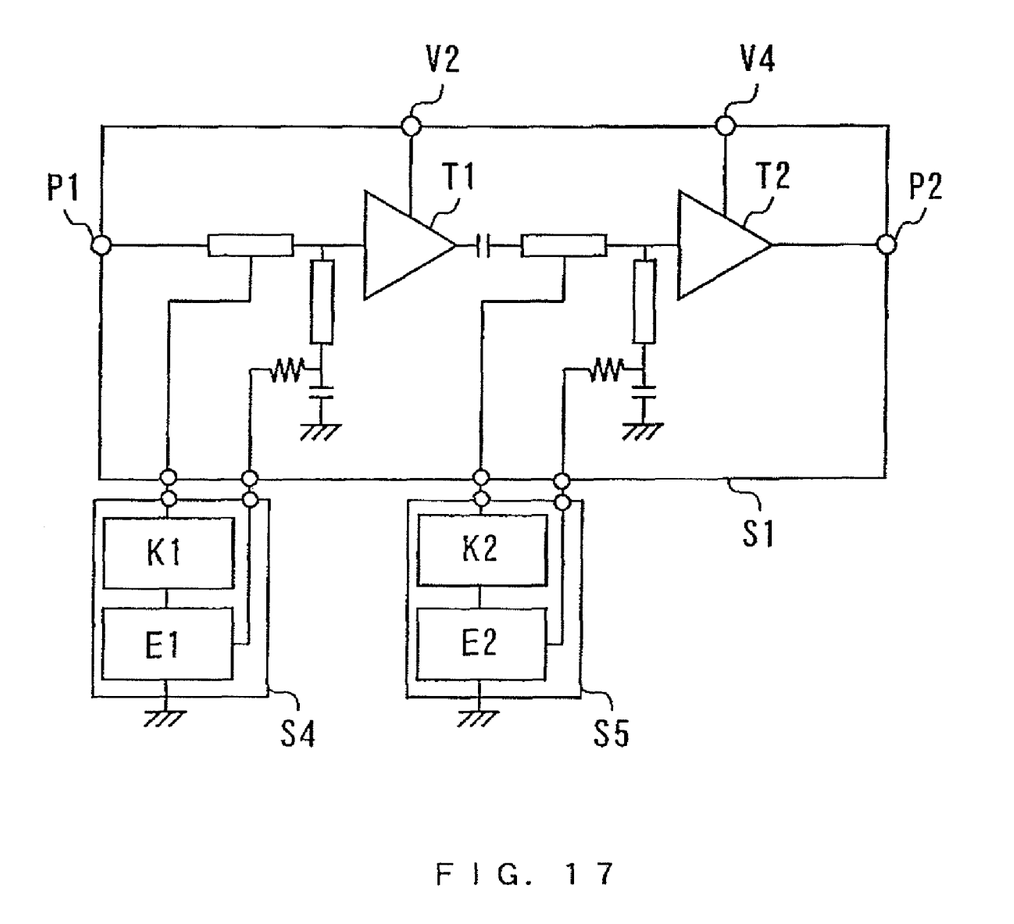

FIGS. 15, 16, and 17 are diagrams showing variations of the MMIC of the fourth embodiment. The MMICs shown in FIGS. 15, 16, and 17 differ from those of FIGS. 11, 12, and 13, respectively, in that each detector circuit is formed on an external substrate instead of on the first substrate. In addition to these variations, the fourth embodiment is susceptible of alterations which are the same as or correspond to those that can be made to the third embodiment.

Thus the present invention makes it possible to prevent rapid reduction of the drain current of an amplifying transistor which would otherwise occur immediately after the power applied to the gate has transitioned from a high level to a low level.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-262651, filed on Nov. 25, 2010 including specification, claims, drawings and summary, on which the Convention priority of the present application is based, are incorporated herein by reference in its entirety.

What is claimed is:

1. A power amplifier comprising:
   an input terminal;
   an input matching circuit connected to said input terminal;
   an amplifying transistor having a gate, a source, and a drain, with said gate connected to said input matching circuit;
   an output matching circuit connected to said drain of said amplifying transistor;
   an output terminal connected to said output matching circuit; and
   an inverting differentiator circuit for either inverting and then differentiating, or differentiating and then inverting, a signal from said input terminal, wherein the output of said inverting differentiator circuit is connected to said gate.

2. The power amplifier according to claim 1, further comprising a plurality of said amplifying transistors, wherein said output of said inverting differentiator circuit is connected to the gates of said plurality of amplifying transistors.

3. The power amplifier according to claim 1, further comprising:
   a plurality of said amplifying transistors; and
   a plurality of said inverting differentiator circuits, each of said inverting differentiator circuits corresponding to a respective one of said amplifying transistors.

4. The power amplifier according to claim 1, further comprising:
   a gate voltage terminal connected to said inverting differentiator circuit;
   a resistance connected at a first end of said resistance to said source of said amplifying transistor; and
   a capacitor connected at a first end of said capacitor to said source of said amplifying transistor, wherein
      said gate voltage terminal is grounded, and
      a second end of said resistance and a second end of said capacitor are grounded.

5. An MMIC comprising:
   an input terminal;
   an input matching circuit connected to said input terminal;
   an amplifying transistor having a gate and a drain, with said gate connected to said input matching circuit;
   an inverting differentiator circuit for either inverting and then differentiating, or differentiating and then inverting, a signal from said input terminal, said inverting differentiator circuit including a detector circuit and an edge detection circuit;
a first substrate on which said input matching circuit, said amplifying transistor, and said detector circuit are located; and
a second substrate on which said edge detection circuit is located, wherein the output of said inverting differentiator circuit is connected to said gate.

6. An MMIC comprising:
an input terminal;
an input matching circuit connected to said input terminal;
an amplifying transistor having a gate and a drain, with said gate connected to said input matching circuit;
an inverting differentiator circuit for either inverting and then differentiating, or differentiating and then inverting, a signal from said input terminal, said inverting differentiator circuit including a detector circuit and an edge detection circuit;
a first substrate on which said input matching circuit and said amplifying transistor are located; and
a second substrate on which said detector circuit and said edge detection circuit are located, wherein the output of said inverting differentiator circuit is connected to said gate.

* * * * *